United States Patent
Guan et al.

[19]

[11] Patent Number: 6,120,611
[45] Date of Patent: Sep. 19, 2000

[54] APPARATUS AND METHOD FOR HERMETICALLY SEALING A CHAMBER

[75] Inventors: Kuen Lin Guan, Chia-Yih; Huang Wen Chen; Wen Shing Liang, both of Hsin-chu, all of Taiwan

[73] Assignee: Taiwan Semiconductor Manufacturing Company, Ltd., Hsin Chu, Taiwan

[21] Appl. No.: 09/204,615

[22] Filed: Dec. 2, 1998

[51] Int. Cl.[7] .................................................. C23C 16/00
[52] U.S. Cl. ........................ 118/733; 118/729; 118/719; 156/345
[58] Field of Search .................................. 118/733, 729, 118/719, 728, 730; 156/345

[56] References Cited

U.S. PATENT DOCUMENTS 5,673,812  10/1997  Nelson ....................................... 221/82

*Primary Examiner*—Shrive Beck
*Assistant Examiner*—P. Hassanzadeh
*Attorney, Agent, or Firm*—Tung & Associates

[57] ABSTRACT

An apparatus and a method for hermetically sealing a vacuum process chamber substantially without frictional force are provided. In the apparatus, a ball bearing is used between a door and a loader stage for facilitating the mounting of the former to the latter. A photosensing element is used which consists of a traversing flag mounted on a loader stage onto which a door is mounted, and a stationary photo transmitter/receiver mounted on the structure onto which a furnace tube is installed. The photosensing device enables the determination of the state of engagement between the door on the cantilever loader assembly and the flange on the furnace tube without any mechanical contact or frictional force occurring in the sensing device. A poorly mated interface between the door and the flange can thus be avoided and a substantially more reliable seal can be achieved between the sealing members. The present invention novel apparatus can be advantageously used in any vacuum process chamber and more particularly, in a horizontal low pressure furnace tube that is frequently utilized in a chemical vapor deposition chamber.

9 Claims, 2 Drawing Sheets

APPARATUS AND METHOD FOR HERMETICALLY SEALING A CHAMBER

FIELD OF THE INVENTION

The present invention generally relates to an apparatus and a method for hermetically sealing a chamber and more particularly, relates to an apparatus and a method in which a non-contact type sensing device is used to ensure that an opening of a vacuum process chamber is hermetically sealed prior to an evacuation of the chamber.

BACKGROUND OF THE INVENTION

In the fabrication process for semiconductor devices, numerous processing steps must be performed on a semi-conducting substrate to form various circuits. The process may consists of as many as several hundred processing steps. Each processing step is executed in a process chamber such as an etcher, a physical vapor deposition (PVD) chamber, a chemical vapor deposition (CVD) chamber or an ion implanter.

In the vast majority of the processing steps, a special environment of either a high vacuum, a low vacuum or a gas plasma environment must be provided for the process. For instance, in a PVD (or sputter) chamber, a high vacuum environment must be provided to surround the wafer such that particles sputtered from a metal target can travel to and be deposited on an exposed surface of the wafer. In other process chambers, such as in a plasma enhanced chemical vapor deposition (PECVD) chamber, a plasma cloud of a reactant gas or gases is first formed in vacuum over a wafer such that the deposition of a chemical substance can occur on the surface of the wafer. During any processing step, the wafer must also be kept in an extremely clean environment without the danger of being contaminated. The processing of a wafer is therefore conducted in a hermetically sealed environment that is under vacuum and completely isolated from the atmosphere. Numerous vacuum process chambers have been provided for such purpose.

A typical vacuum process chamber 10 consists of a horizontal furnace tube 12 and a cantilever loader assembly 14 is shown in FIG. 1. The vacuum process chamber 10 is a low pressure chemical vapor deposition chamber that is frequently used for depositing films on wafers. The furnace tube 12 is formed in an elongated shape with one end 16 sealed and connected to an evacuation means (not shown) such as a high capacity vacuum pump. The furnace tube 12 can be fabricated of a high temperature material such as quartz and be equipped with a flange 18 for sealing against a door 20 mounted on a cantilever loader assembly 14. The cantilever loader assembly 14 is typically provided with cantilever sheaths 22 for supporting a plurality of wafer boats (not shown). Wafers 24, which are positioned on wafer boats are loaded onto the cantilever sheaths 22.

In operating the vacuum process chamber 10, a cantilever loader assembly 14 is first loaded with wafers 24 which are positioned in various wafer boats (not shown) on the cantilever sheaths. The cantilever loader assembly is then slid into the furnace tube 12 on a loader stage (not shown) and guided into the furnace tube 12. After the loader assembly 14 is completely inserted into the furnace tube 12, the door 20 on the cantilever loader assembly 14 engages the flange 18 on the furnace tube 12 and is pressed tightly against an O-ring seal (not shown) on the flange 18. In order to ensure that the door 20 is properly closed on the furnace tube 12, a pressure switch 26 is provided in the flange 18 for sensing the proper positioning of the door 20. The pressure switch 26 may either be pressed down by the door 20 itself, or by a pressure switch push pin 28 which is mounted on the door 20 for engaging the pressure switch 26 when the door 20 is properly closed on flange 18. A signal is sent out by the pressure switch 26 after a proper engagement has been achieved to a central process controller which then starts the high capacity vacuum pump for evacuating the interior cavity 30 of the furnace tube 12.

A detailed side view of the cantilever loader assembly 14 which illustrates a loader stage 34 for supporting the door 20 is shown in FIG. 2. The loader stage 34 has three sheaths 36 mounted thereto at end 38. A loader bracket 40 is utilized for mounting the door 20 to the loader stage 34 through a mounting block 42. The mounting block 42 is fastened to the loader bracket 40 through an aperture 44 and a bolt 46 and spring 48. The boat 46 is fastened to threads provided in an aperture 50 in the loader bracket 40. The loader bracket 40 is fastened to the loader stage 34 through mechanical fastening means 52. After the mounting block 42 is fastened to the loader bracket 40, the door 20 is connected to the loader stage 34 by inserting an universal joint 54 for guiding into the aperture 56 of the mounting block 42 and then fastening by screw 60 and spring 58. During the assembly of the door 20 to the loader stage 34, the three sheaths 36 are mounted through sheath bellows 62 that are provided on the door 20. A plane view of the door 20 is also shown in FIG. 2 illustrating the pressure switch push pin 28, the sheaths 36 and the universal joint 54.

As shown in FIG. 2, the universal joint 54 mounted on the door 20 is used to facilitate the mounting of the door 20 on the mounting block 42. The universal joint 54 allows an easy alignment through the mounting hole 56 located in the mounting block 42 such that it can be guided through the hole for fastening by bolt 60. In this conventional set up for a low pressure chemical vapor deposition chamber, the insertion of the universal joint 54 through the mounting hole 56 is sometimes difficult to carry out due to the frictional force existed between the universal joint and the hole. The friction between the two members limits the freedom of movement of the universal joint 54 and affects the mounting of the door 20 to the mounting block 42.

In the conventional set up, shown in FIG. 2, the pressure switch push pin 28 is used to sense and determine the proper positioning or sealing of the door 20 on the mounting flange 18 located on the furnace tube 12 (shown in FIG. 1). The mechanical force required to push the pressure switch push pin 28 against the pressure switch 26 sometimes cause the tilting of the door 20 and thus preventing a perfect flush mounting of the two members together. A defectively mounted position occurs when a seal between the door and the flange is not achieved, even though the pressure switch 26 already sent out a signal to the central process controller indicating that a seal has been achieved and thus the vacuum pump is turned on. Such defective conditions therefore result in a poorly sealed chamber and on inability of the cavity in the furnace tube to achieve a desirable vacuum.

It is therefore an object of the present invention to provide an apparatus for hermetically sealing a vacuum process chamber that does not have the drawbacks and shortcomings of the conventional apparatus.

It is another object of the present invention to provide an apparatus for hermetically sealing a vacuum process chamber that has minimum frictional engagement between two members sealed against each other.

It is a further object of the present invention to provide an apparatus for hermetically sealing a vacuum process chamber that utilizes a sensing device for sensing the state of sealing between two components without requiring mechanical contact.

It is another further object of the present invention to provide an apparatus for hermetically sealing a vacuum process chamber by utilizing a ball bearing between two mating members such that frictional engagement is minimized.

It is still another object of the present invention to provide an apparatus for hermetically sealing a vacuum process chamber by utilizing a photosensing device for detecting a state of engagement between two members.

It is yet another object of the present invention to provide an apparatus for hermetically sealing a vacuum process chamber that utilizes a flag traversing on a moving component and a photo transmitter/receiver that is stationarily mounted on a second component for detecting the state of engagement between the two components.

It is still another further object of the present invention to provide a method for hermetically sealing a vacuum process chamber by utilizing a ball bearing for engagement between the members to reduce frictional force.

It is yet another farther object of the present invention to provide a method for hermetically sealing a vacuum process chamber by utilizing a photosensing device such that mechanical contact between two sealing members is completely eliminated.

SUMMARY OF THE INVENTION

In accordance with the present invention, an apparatus and a method for hermetically sealing a vacuum process chamber by utilizing a ball bearing for reducing friction between the components and a photosensing device for eliminating mechanical contact are disclosed.

In a preferred embodiment, an apparatus for hermetically sealing a vacuum process chamber is provided which includes a chamber housing containing a cavity therein and a flange at an opening of the housing adapted for receiving an insert assembly, an insert assembly consisting of an insert and a door situated at an extreme end of the insert for sealingly engaging the flange on the opening of the chamber housing when the insert is positioned in the cavity, and a photosensing device for determining a state of engagement between the chamber housing and the insert assembly.

In the apparatus for hermetically sealing a vacuum process chamber, the chamber housing may be a low pressure chemical vapor deposition furnace tube. The insert assembly may be a wafer loader assembly, or a loader for wafer boats. The door may be integrally connected to the insert. The photosensing means may include a traversing flag and a stationary photo transmitter/receiver. The photosensing device may further include a flag mounted on the insert assembly for traversing with the assembly and a photo transmitter/receiver mounted stationarily for engaging the flag. The apparatus may further include a cantilever loader for supporting the door.

The present invention is further directed to a method for hermetically sealing a vacuum process chamber which can be carried out by the operating steps of first providing a chamber housing containing a cavity therein and a flange at an opening of the housing for receiving an insert assembly, then providing an insert assembly including an insert and a door situated at an extreme end of the insert, then positioning the insert in the cavity and sealingly engaging the door on the insert assembly with the flange on the opening, and determining a state of engagement between the chamber housing and the insert assembly by a photosensing device.

The method for hermetically sealing a vacuum process chamber may further include the step of mounting a flag on the traversing insert assembly for engaging a photo transmitter/receiver mounted stationarily on a loader stage with the chamber housing. In the method, the chamber housing may be a low pressure chemical vapor deposition chamber and the insert assembly may be a wafer boat carrier. The method may further include the step of evacuating the cavity of the chamber housing after a state of engagement between the chamber housing and the insert assembly is determined. The method may further include the step of engaging a cantilever loader with a door through the engagement between a bearing and a universal joint such that the cantilever loader operates the door by traversing the door and the insert assembly in and out of the chamber housing.

The present invention is still further directed to an apparatus for hermetically sealing a vacuum process chamber which includes a chamber that has a cavity therein and a flange at an opening of the chamber adapted for receiving a wafer loader assembly, a wafer loader assembly which has a cantilever loader and a door unitarily connected to the loader for sealingly engaging the flange on the chamber opening when the wafer loader assembly is positioned in the cavity, and a photosensing device for determining a state of engagement between the process chamber and the wafer loader assembly.

In the apparatus for hermetically sealing a vacuum process chamber, the vacuum process chamber may be a low pressure chemical vapor deposition chamber. The wafer loader assembly may be a loader for wafer boats. The photosensing device may include a flag and a photo transmitter/receiver. The photosensing device may further include a flag mounted on the cantilever for traversing with the loader and a photo transmitter/receiver mounted stationarily for engaging the flag.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
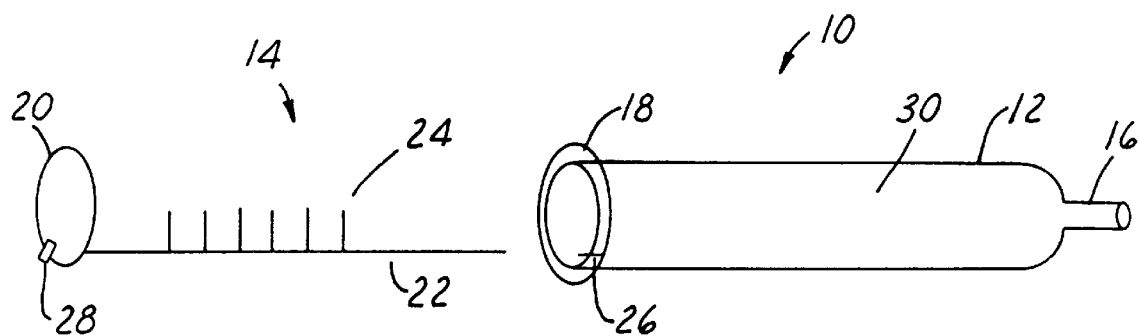
FIG. 1 is an illustrating of a conventional vacuum process chamber for mounting a cantilever loader assembly therein.
Figure 2:
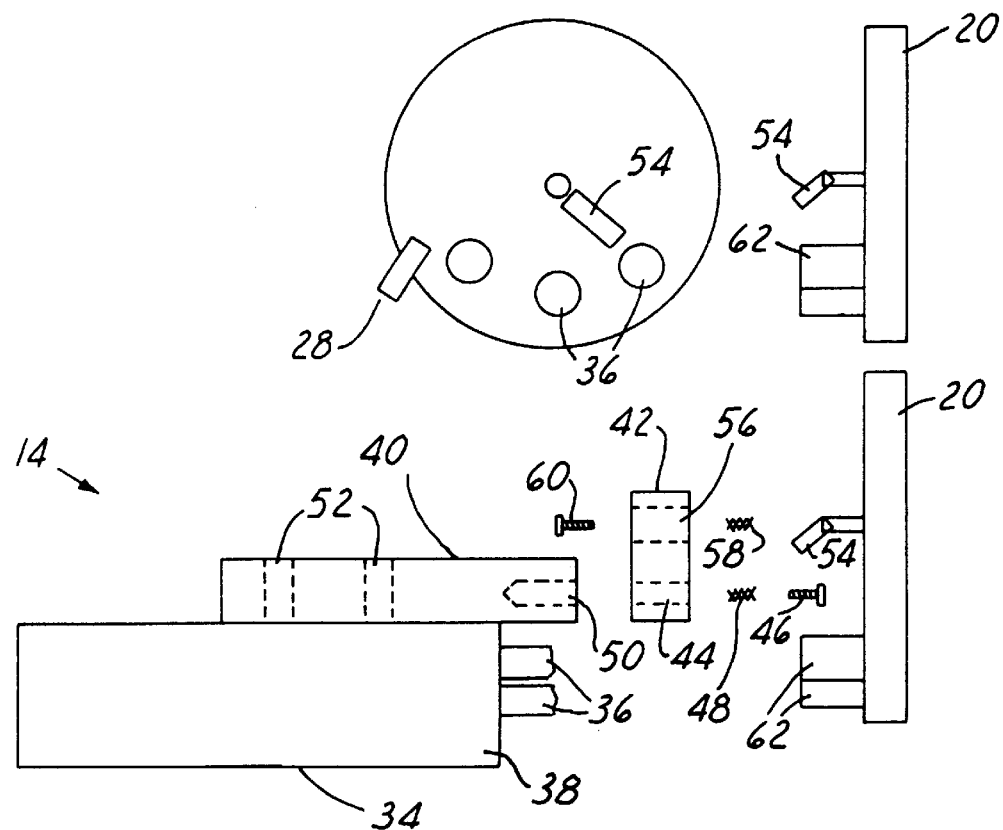
FIG. 2 is a detailed side view and plane view of the cantilever loader assembly of FIG. 1 showing the loader stage and the door in the cantilever loader assembly.

The present invention discloses an apparatus and a method for hermetically sealing a vacuum process chamber by minimizing frictional engagement between the sealing members and by utilizing a photosensing device for determining the state of engagement between members. The present invention novel apparatus is most suitable for use in a horizontal low pressure furnace tube system, such as a low pressure chemical vapor deposition chamber. However, the apparatus and method may also be used for any other vacuum process chambers that requires the engagement between two members for achieving a vacuum tight seal. For instance, in a low pressure chemical vapor deposition chamber furnace tube, a ball screw is first used to drive a loader station, or a cantilever loader assembly into the furnace tube. As soon as a pressure switch push pin mounted on the door of the loader assembly pushes against a pressure switch mounted on the flange of the furnace tube, a vacuum pump is actuated to withdraw air from the furnace tube and to start the pump-down function. In a conventional set up, when a pump-down function is failed, the fabrication process is aborted which affects the throughput of the fabrication process. When the pump-down function is failed, it causes further implications such as possible chamber contamination and particle issues. Furthermore, the components in the vacuum pump and the life time of the pump may also be affected by the failed seal between the loader station and the furnace tube. A properly sealed door on the furnace tube is therefore an important aspect of the total fabrication process when operating a low pressure chemical vapor deposition furnace tube.

In order to prevent defects caused by a failed door seal, a system must make sure that an O-ring sealed flange is covered by a door. A door position sensor, or a pressure switch, is used to sense if door has fully covered the O-ring sealed flange in the conventional set up. However, in spite of the door safety installation, and the fact that the door has covered the flange of the tube, the pump-down function can still fail based on two other reasons. First, the door position sensor function of the pressure switch failed to sense the door position caused by an unstable pressure source for the pressure switch resulting in a false alarm. For instance, the pressure switch push pin may miss the pressure switch all together in the pushing action by the pin. Secondly, the door does not cover the O-ring sealed flange tightly due to a failed mechanical structure or an excessively high door push pin frictional force.

The present invention novel apparatus and method therefore is provided for achieving a robust door seal structure in a horizontal low pressure furnace tube vacuum system. The key elements of the present invention novel apparatus include, a bearing structure used to ensure a smooth door closing action by reducing the frictional force between a universal joint and a mounting bracket, and a non-contact photosensing device instead of a pressure door switch. The mechanical resistance between a pressure switch push pin and a pressure switch can be completely eliminated during the door closing action. Furthermore, a photosensing device is more stable than a pressure switch and thus the occurrence of false alarm or failed door closing action is reduced.

Figure 3:
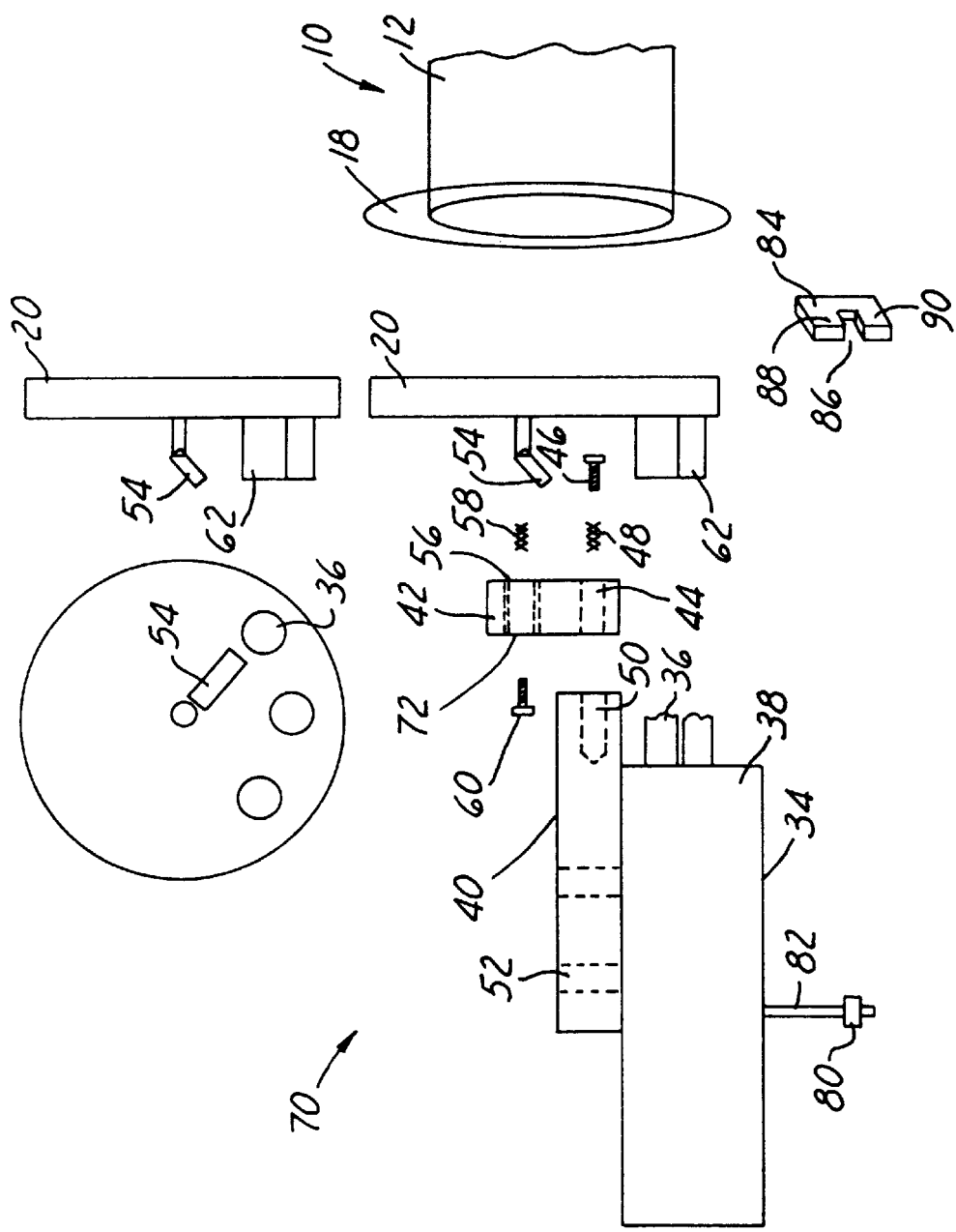
FIG. 3 is a detailed side view of the present invention cantilever loader assembly equipped with ball bearing and a photosensing device.

Referring now to FIG. 3, wherein a detailed side view of the present invention novel apparatus 70 is shown. In the apparatus 70, a cantilever loader stage 34 similar to that used previously except that no pressure switch push pin is used is provided. A plurality of sheaths 36 is mounted to the loader stage 34 at the end 38. A mounting bracket 40 is mounted on the loader stage 34 through mounting holes 52. A mounting block 42 is connected to the loader bracket 40 through mounting holes 44, 50 by using bolt 46 and spring 48. After the mounting block 42 is connected to the loader bracket 40, the door 20 is mounted to the mounting block 42 by guiding the universal joint 54 through ball bearing 72, spring 58 and bolt 60. The use of the ball bearing 72 in the aperture 56 for the installation of the universal joint 54 greatly reduces the frictional engagement between the two members.

A photosensing device which includes a flag 80 mounted on a support 82 and a photo transmitter/receiver 84 mounted stationarily on a structure (not shown) for holding the furnace tube 12 are utilized. The flag 80, with the door 20 and the flange 18 in an engaged or fully closed position, fits in the opening 86 and blocks a photo transmission from the transmitter 88 to the receiver 90. It should be noted that flag 80 fits in the aperture 86 without touching the transmitter 88 or the receiver 90 and thus no frictional force or mechanical contact is involved. This provides a perfect seal between the door 20 and the flange 18 when the former is pressed against the latter by the loader stage 34. No tilting of the door 20 against the flange 18 would occur due to any frictional force produced by the sensing element. The present invention novel apparatus and method therefore produce a more reliable method for determining the state of engagement between the door 20 and the flange 18 without introducing any intrinsic factors such as frictional force which might otherwise influence the seal between the two members.

The present invention novel apparatus and method have therefore been amply demonstrated in the above descriptions and in the appended drawing of FIG. 3.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. An apparatus for hermetically sealing a chamber comprising:
   a semiconductor process chamber housing having a cavity therein,
   a flange at an opening of the housing adapted for receiving a wafer loader assembly,
   a wafer loader assembly having a door situated at an extreme end of said assembly for sealingly engaging said flange on said opening of the semiconductor process chamber housing when the assembly is positioned in the cavity, and
   a photosensing means comprising a flag and a photo transmitter/receiver for determining a state of engagement between said semiconductor process chamber housing and said wafer loader assembly.

2. An apparatus for hermetically sealing a chamber according to claim 1, wherein said chamber housing is a low pressure chemical vapor deposition (LPCVD) furnace tube.

3. An apparatus for hermetically sealing a chamber according to claim 1, wherein said door is integrally connected to the insert.

4. An apparatus for hermetically sealing a chamber according to claim 1, wherein said photosensing means comprises a flag and a photo transmitter/receiver.

5. An apparatus for hermetically sealing a chamber according to claim 1, wherein said photosensing means includes a flag mounted on said insert assembly for traversing with the insert assembly and a photo transmitter/receiver mounted stationarily for engaging said flag.

6. An apparatus for hermetically sealing a chamber according to claim 1 further comprising a cantilever loader for supporting said door.

7. An apparatus for hermetically sealing a vacuum process chamber comprising:
   a semiconductor process chamber having a cavity therein and a flange at an opening of the chamber adapted for receiving a water loader assembly,
   a wafer loader assembly having a cantilever loader for wafer boats and a door integrally connected to said loader for sealingly engaging the flange on the chamber opening when the wafer loader assembly is positioned in said cavity, and a photosensing means comprising a flip and a photo transmitter/receiver for determining a state of engagement between the semiconductor process chamber and the wafer loader assembly.

8. An apparatus for hermetically sealing a vacuum process chamber according to claim 7, wherein said vacuum process chamber is a low pressure chemical vapor deposition (LPCVD) chamber.

9. An apparatus for hermetically sealing a vacuum process chamber according to claim 7, wherein said photosensing means comprises a flag mounted on said cantilevered loader for traversing with said loader and a photo transmitter/receiver mounted stationarily for engaging said flag.

* * * * *